(12) United States Patent
Tamura et al.

(10) Patent No.: US 6,741,900 B2
(45) Date of Patent: May 25, 2004

(54) DESIGN SUPPORT APPARATUS, DESIGN SUPPORT METHOD, AND PROGRAM

(75) Inventors: Yasuhiko Tamura, 4-4-4-305, Sengoku, Bunkyo-ku, Tokyo 112-0011 (JP); Yoshinori Iizuka, 5-1-8-419, Tsurumaki, Setagaya-ku, Tokyo 154-0016 (JP)

(73) Assignees: Justsystem Corporation, Tokushima (JP); Yoshinori Iizuka, Tokyo (JP); Yasuhiko Tamura, Tokyo (JP)

( * ) Notice: Subject to any disclaimer, the term of this patent is extended or adjusted under 35 U.S.C. 154(b) by 0 days.

(21) Appl. No.: 10/243,652

(22) Filed: Sep. 16, 2002

(65) Prior Publication Data

US 2003/0182635 A1 Sep. 25, 2003

(30) Foreign Application Priority Data

Mar. 19, 2002 (JP) ........................................ 2002-076895

(51) Int. Cl.[7] .............................................. G06F 19/00
(52) U.S. Cl. .......................... 700/97; 700/90; 700/91; 700/95; 700/115
(58) Field of Search ............................ 700/95, 97, 90, 700/91, 115; 703/1; 706/919

(56) References Cited

U.S. PATENT DOCUMENTS 6,052,652 A * 4/2000 Lee ............................. 700/97
6,343,285 B1 * 1/2002 Tanaka et al. ................ 700/97

* cited by examiner

*Primary Examiner*—Leo Picard
*Assistant Examiner*—Charles Kasenge
(74) *Attorney, Agent, or Firm*—Sughrue Mion, PLLC (57) ABSTRACT

An input reception unit of a design support apparatus receives input of a definition attribute name of a product to be designed. A definition attribute obtaining unit, control attribute obtaining unit and stress obtaining unit obtain parameter names usable for calculating a strength value and stress value, based on the definition attribute name. The input reception unit further receives input of parameter values of the parameter names. A strength calculation unit calculates a strength value of the product to be designed in accordance with a predetermined calculation procedure using the parameter value. The stress calculation unit calculates a value of stress applied to the product to be designed in accordance with a predetermined calculation procedure using the parameter value. The comparison report unit compares the strength value and the stress value, and reports report information associated with those values in a case where the comparison result satisfies a predetermined condition.

12 Claims, 7 Drawing Sheets

| STRENGTH NAME | PARAMETER NAME | CALCULATION MEANS |
|---|---|---|
| ⋮ | ⋮ | ⋮ |
| LIMITED PV VALUE | GUARANTEED OPERATION HOUR Hr<br>AMOUNT OF WEAR TOLERANCE δ<br>WEAR COEFFICIENT K | $\dfrac{\delta}{Hr \cdot K}$ |
| ⋮ | ⋮ | ⋮ |

FIG.4

| STRESS NAME | PARAMETER NAME | CALCULATION MEANS |
|---|---|---|
| ⋮ | ⋮ | ⋮ |
| PV VALUE | PRESSURE P<br>SLIDING VELOCITY V | $P \cdot V$ |
| ⋮ | ⋮ | ⋮ |

FIG.5

| STRESS NAME | STRENGTH NAME | COMPARISON MEANS | CONDITION | REPORT INFORMATION |
|---|---|---|---|---|
| ⋮ | ⋮ | ⋮ | ⋮ | ⋮ |
| PV VALUE | LIMITED PV VALUE | > | TRUE | WEAR WILL BE CAUSED |
| ⋮ | ⋮ | | | |

DESIGN SUPPORT APPARATUS, DESIGN SUPPORT METHOD, AND PROGRAM

BACKGROUND OF THE INVENTION

1. Field of the Invention

The present invention relates to a design support apparatus, a design support method, and a program for realizing these apparatus and method in a computer.

2. Description of the Related Art

Conventionally, there have been proposed design support methods using computers, such as CAD/CAM (Computer Aided Design/Computer Aided Manufacturing) systems, etc. When designing apparatuses constituted by various components, whether those components and apparatuses made of those components satisfy requirements must be fully checked. Computer supports are demanded also in such situations.

Further, it is difficult for man to predict with ease at the time of designing whether the designed product will cause any problem when it is actually manufactured. It requires years of experience and sense to acquire knowledge for such prediction.

However, today's situation where products to be designed are becoming more varied and complex requires a design support environment with a computer which does not simply count on engineers' experience and sense, but shares their experience and sense as "knowledge" and utilizes the knowledge at the time of designing.

SUMMARY OF THE INVENTION

The present invention has been made to solve the above described problems. Accordingly, an object of the present invention is to provide a design support apparatus and design support method suitable for discovering at the time of designing, possibility of causing any problem in a product (including any kind of parts of a commodity, components and designed items) to be designed, and a program for controlling a computer to realize such apparatus and method.

To achieve the above object, the following invention is disclosed in accordance with the principle of the present invention.

A design support apparatus according to a first aspect of the present invention comprises an input reception unit, a strength calculation unit, a stress calculation unit, and a comparison report unit. The design support apparatus is structured as follows:

the input reception unit receives an input of a parameter name of a product to be designed and a parameter value associated with the parameter name;

the strength calculation unit calculates a strength value of the product to be designed using the parameter name and the parameter value whose input has been received, in accordance with a predetermined calculation procedure;

the stress calculation unit calculates a value (stress value) of a stress which is applied to the product to be designed using the parameter name and the parameter value whose input has been received, in accordance with a predetermined calculation procedure; and the comparison report unit compares the calculated strength value with the calculated stress value, and reports report information which is associated with the comparison in a case where the comparison satisfies a predetermined condition.

According to this invention, a strength value corresponding to the strength of a product to be designed and a stress value corresponding to a stress imposed on the product to be designed are automatically estimated and compared with each other at the time of designing. Accordingly, it is possible to obtain various report information including information regarding a problem to be caused.

A design support apparatus according to a second aspect of the present invention comprises a definition attribute dictionary unit, a strength dictionary unit, a stress dictionary unit, a comparison report dictionary unit, an input reception unit, a definition attribute obtaining unit, a strength obtaining unit, a stress obtaining unit, a report information obtaining unit, a strength calculation unit, a stress calculation unit, and a comparison report unit. The design support apparatus is structured as follows:

the definition attribute dictionary unit stores a definition attribute name, parameter names which relate to the definition attribute name, and remarks about whether the respective parameter names are a control attribute or a stress attribute, in association with one another;

the strength dictionary unit stores a strength name, a parameter name of a control attribute which is necessary for calculating the strength name, and a procedure for calculating a value (strength value) associated with the strength name using a value (parameter value) of the parameter name;

the stress dictionary unit stores a stress name, a parameter name which relates to the stress name, and a procedure for calculating a value (stress value) associated with the stress name using a value (parameter value) associated with the parameter name;

the comparison report dictionary unit stores a strength name, a stress name, comparison means for comparing the strength name and the stress name, and report information to be reported in a case where a result of the comparison satisfies a predetermined condition, in association with one another;

the input reception unit receives an input of definition attribute names of a product to be designed;

the definition attribute obtaining unit obtains a definition attribute name which is stored in the definition attribute dictionary unit from among the input definition attribute names, parameter names which relate to the obtained definition attribute name, and remarks about whether the respective parameter names are a control attribute or a stress attribute;

the strength obtaining unit obtains a strength name which can be calculated using any of the obtained parameter names that is a control attribute, and a procedure for calculating a strength value associated with the strength name, from the strength dictionary unit;

the stress obtaining unit obtains a stress name which can be calculated using any of the obtained parameter names that is a stress attribute, and a procedure for calculating a stress value associated with the stress name, from the stress dictionary unit;

in a case where the obtained strength name which can be calculated and the obtained stress name which can be calculated are stored in association with each other in the comparison report dictionary unit, the report information obtaining unit obtains a comparison procedure which is stored in association with those strength name and stress name, and report information to be reported in a case where a result of the comparison satisfies a predetermined condition;

in a case where the comparison procedure and the report information are obtained by the report information obtaining unit, the input reception unit further receives an input of a parameter value associated with any of the obtained parameter names that is a control attribute and a parameter value associated with any of the obtained parameter names that is a stress attribute;

the strength calculation unit calculates a strength value in accordance with the obtained procedure for calculating a strength value, using the input parameter value associated with any of the obtained parameter names that is a control attribute;

the stress calculation unit calculates a stress value in accordance with the obtained procedure for calculating a stress value, using the input parameter value associated with any of the obtained parameter names that is a stress attribute; and the comparison report unit compares the calculated strength value with the calculated stress value in accordance with the obtained comparison procedure, and reports the obtained report information in a case where a result of the comparison satisfies a predetermined condition.

According to this invention, it is possible to receive an input of a definition attribute, a control attribute, and stress of a product to be designed from a user, calculate a strength value and stress value, and present report information to the user.

The design support apparatus according to the second aspect may further comprise a control attribute dictionary unit and a substitution relation obtaining unit. The design support apparatus may be structured as follows:

the control attribute dictionary unit stores, in a case where a parameter value associated with a parameter name which is a control attribute can be substituted by a parameter value associated with another parameter name which is a control attribute, the parameter name which can be used as substitution and the parameter name which can be substituted, as a substitution relation;

the substitution relation obtaining unit obtains a pair of parameter names which are control attributes and stored in the control attribute dictionary unit as a substitution relation, from among the obtained parameter names which are control attributes;

the input reception unit further receives, in a case where any of the obtained parameter names that is a control attribute is the parameter name which is indicated by the obtained substitution relation as can be substituted, an input of a parameter value associated with the parameter name which can be substituted, or a parameter value associated with the parameter name which can be used as substitution; and in a case where the obtained procedure for calculating a strength value designates use of the parameter value associated with the parameter name which is indicated by the obtained substitution relation as can be substituted and the input reception unit receives an input of the parameter value associated with the parameter name which can be used as substitution instead of the parameter value associated with the parameter name which can be substituted, the strength calculation unit calculates a strength value by substituting the parameter value associated with the parameter name which can be substituted, by the parameter value associated with the parameter name which can be used as substitution.

According to this invention, in consideration of a substitution relation between a control attribute and another control attribute, even if the value associated with a given control attribute is not input, but if the value associated with a control attribute which can be used as substitution of the given control attribute is input, it is possible to calculate a strength value using the substitutive control attribute, and thus reduce user's workload of inputting.

The design support apparatus according to the second aspect may be structured as follows:

in a case where a parameter value associated with a parameter name which is a control attribute can be calculated in accordance with a calculation procedure using a parameter value associated with another parameter name which is a control attribute, the control attribute dictionary unit further stores the calculation procedure, the parameter name (calculation-use parameter name) which is used in the calculation procedure, and the parameter name (calculation result parameter name) which is a result of the calculation procedure, as a calculation relation;

the substitution relation obtaining unit obtains a calculation relation which indicates any of the obtained parameter names that is a control attribute as a calculation result parameter name and its corresponding calculation-use parameter name, from the control attribute dictionary unit;

in a case where any of the obtained parameter name that is a control attribute is the calculation result parameter name of the obtained calculation relation, the input reception unit further receives an input of a parameter value associated with the calculation result parameter name, or a parameter value associated with the calculation-use parameter name; and in a case where the obtained procedure for calculating a strength value designates use of the parameter value associated with the calculation result parameter name of the obtained calculation relation and the input reception unit receives an input of the parameter value associated with the calculation-use parameter name instead of the parameter value associated with the calculation result parameter name, the strength calculation unit obtains the calculation procedure of the calculation relation from the control attribute dictionary unit, calculates a parameter value in accordance with the calculation procedure using the parameter value associated with the calculation-use parameter name whose input has been received, and calculates the strength value by substituting the parameter value associated with the calculation result parameter name by the calculated parameter value.

According to this invention, in a case where a parameter value necessary for calculating a strength value can be calculated using a parameter value already input by a user, it is possible to automatically calculate the necessary parameter value using the parameter value already input, and further calculate the strength value, and thus reduce user's workload of inputting.

The design support apparatus according to the second aspect may be structured as follows:

the definition attribute dictionary unit further stores a parent-child relation between a definition attribute name and another definition attribute name; and in a case where any parent-child relation in which a definition attribute name which has already been obtained by the definition attribute obtaining unit is a child is stored in the definition attribute dictionary unit, the definition attribute obtaining unit obtains a definition attribute name which is a parent of the parent-child relation, parameter names which relate to the parent definition attribute name, and remarks about whether the respective parameter names are a control attribute or a stress attribute.

According to this invention, with regard to definition attributes in a parent-child relation, it is possible to expand a field to be searched toward the direction of the parent, and thus obtain more report information. Particularly in a case where the parent-child relation is constituted such that "the parent represents a more general nature and the child represents a more specific nature", the field to be searched can be expanded toward the direction of the general nature.

The design support apparatus according to the second aspect may be structured as follows:

the definition attribute dictionary unit can store a parent-child relation in which a given definition attribute name is a parent and another definition attribute name is a child, and also a parent-child relation in which the given definition attribute name is a child and the another definition attribute name is a parent.

According to this invention, two definition attributes which are in a parent-child relation can also be represented as being in a child-parent relation, and information relating to both of the two definition attributes is stored in the definition attribute dictionary unit. Due to this, it is possible to further expand the field to be searched, and obtain more report information.

The design support apparatus according to the second aspect may be structured as follows:

the definition attribute dictionary unit further stores a parent-child relation between a definition attribute name and another definition attribute name; and in a case where any parent-child relation in which a definition attribute name which has already been obtained by the definition attribute obtaining unit is a parent is stored in the definition attribute dictionary unit and there are a plurality of definition attribute names each of which is a child of the parent definition attribute name, the definition attribute obtaining unit receives an input for selecting one or more of the plurality of child definition attribute name(s), and obtains the selected child definition attribute name(s), parameter names which relate to the selected child definition attribute name(s), and remarks about whether the respective parameter names are a control attribute or a stress attribute.

According to this invention, with regard to definition attributes in a parent-child relation, it is possible to expand the field to be searched toward the direction of the child and obtain more report information, while it is possible to appropriately urge the user to restrict the field to be searched so as not to be too broadened. Particularly, in a case where the parent-child relation is constituted such that "the parent represents a more general nature and the child represents a more specific nature", it is possible to expand the field to be searched toward the direction of the specific nature.

The design support apparatus according to the second aspect may be structured as follows:

the definition attribute dictionary unit can store a parent-child relation in which a given definition attribute name is a parent and another definition attribute name is a child, and also a parent-child relation in which the given definition attribute name is a child and the another definition attribute name is a parent.

According to this invention, two definition attributes which are in a parent-child relation can also be represented as being in a child-parent relation, and information relating to both of the two definition attributes is stored in the definition attribute dictionary unit. Due to this, it is possible to further expand the field to be searched, and obtain more report information. On the other hand, it is possible to appropriately urge the user to restrict the field to be searched so as no to be too broadened.

The design support apparatus according to the second aspect may be structured as follows:

the definition attribute dictionary unit further stores an exclusive relation between a definition attribute name and another definition attribute name;

report information stored in the comparison report dictionary unit includes a definition attribute name which relates to the report information itself; and the comparison report unit reports, among obtained report information, report information whose corresponding predetermined condition is satisfied and which does not include a definition attribute name which is stored in the definition attribute dictionary unit as constituting an exclusive relation with any of the input definition attribute names.

According to this invention, it is possible to carefully select report information to be actually reported from among the obtained report information and exclude unnecessary report information as much as possible, and thus present only necessary report information to the user.

The design support apparatus according to the second aspect may be structured as follows:

the input reception unit further receives an input of a to-be-excluded definition attribute name which should be excluded from the product to be designed;

report information stored in the comparison report dictionary unit includes a definition attribute name which relates to the report information itself; and the comparison report unit reports, among the obtained report information, report information whose corresponding predetermined condition is satisfied and which does not include the input to-be-excluded definition attribute name.

According to this invention, it is possible to carefully select report information to be actually reported from among the obtained report information and exclude unnecessary report information as much as possible, and thus present only necessary report information to the user.

The design support apparatus according to the second aspect may be structured as follows:

report information stored in the comparison report dictionary unit includes a definition attribute name which relates to the report information itself; and the comparison report unit reports, among the obtained report information, report information whose corresponding predetermined condition is satisfied and at least one of whose including definition attribute names is any of the input definition attribute names.

According to this invention, it is possible to carefully select report information to be actually reported from among the obtained report information and exclude unnecessary report information as much as possible, and thus present only necessary report information to the user.

A design support method according to a third aspect of the present invention comprises an input receiving step, a strength calculating step, a stress calculating step, and a comparison reporting step. The design support method is structured as follows:

the input receiving step receives an input of a parameter name of a product to be designed and a parameter value associated with the parameter name;

the strength calculating step calculates a strength value of the product to be designed using the parameter name and parameter value whose input has been received, in accordance with a predetermined calculation procedure;

the stress calculating step calculates a value (stress value) of a stress which is applied to the product to be designed using the parameter name and parameter value whose input has been received, in accordance with a predetermined calculation procedure; and the comparison reporting step compares the calculated strength value with the calculated stress value and reports report information which is associated with a result of the comparison, in a case where the result of the comparison satisfies a predetermined condition.

A design support method according to a fourth aspect of the present invention is a method which:

refers to: a definition attribute dictionary unit which stores a definition attribute name, parameter names which relate to the definition attribute name, and remarks about whether the respective parameter names are a control attribute or a stress attribute, in association with one another;

a strength dictionary unit which stores a strength name, a parameter name of a control attribute which is necessary for calculating the strength name, and a procedure for calculating a value (strength value) of the strength name using a value (parameter value) of the parameter name;

a stress dictionary unit which stores a stress name, a parameter name which relates to the stress name, and a procedure for calculating a value (stress value) of the stress name using a value (parameter value) of the parameter name; and a comparison report dictionary unit which stores a strength name, a stress name, comparison means for comparing the strength name and the stress name, and report information to be reported in a case where a result of the comparison satisfies a predetermined condition, in association with one another; and comprises: an input receiving step; a definition attribute obtaining step; a strength obtaining step; a stress obtaining step; a strength calculating step; a stress calculating step; a report information obtaining step; and a comparison reporting step. The design support method is structured as follows:

the input receiving step receives an input of definition attribute names of a product to be designed;

the definition attribute obtaining step obtains a definition attribute name which is stored in the definition attribute dictionary unit from among the input definition attribute names, parameter names which relate to the obtained definition attribute name, and remarks about whether the respective parameter names are a control attribute or a stress attribute;

the strength obtaining step obtains a strength name which can be calculated using any of the obtained parameter names that is a control attribute, and a procedure for calculating a value (strength value) associated with the strength name, from the strength dictionary unit;

the stress obtaining step obtains a stress name which can be calculated using any of the obtained parameter names that is a stress attribute, and a procedure for calculating a value (stress value) associated with the stress name, from the stress dictionary unit;

in a case where the obtained strength name which can be calculated and the obtained stress name which can be calculated are stored in association with each other in the comparison report dictionary unit, the report information obtaining step obtains a comparison procedure which is stored in association with those strength name and stress name, and report information to be reported in a case where a result of the comparison satisfies a predetermined condition;

in a case where the comparison procedure and the report information are obtained in the report information obtaining step, the input receiving step further receives an input of a parameter value associated with any of the obtained parameter names that is a control attribute and a parameter value associated with any of the obtained parameter names that is a stress attribute;

the strength calculating step calculates a strength value in accordance with the obtained procedure for calculating a strength value, using the input parameter value associated with any of the obtained parameter names that is a control attribute;

the stress calculating step calculates a stress value in accordance with the obtained procedure for calculating a stress value, using the input parameter value associated with any of the obtained parameter names that is a stress attribute; and the comparison reporting step compares the calculated strength value with the calculated stress value in accordance with the obtained comparison procedure, and reports the obtained report information in a case where a result of the comparison satisfies a predetermined condition.

A program according to a fifth aspect of the present invention causes a computer to serve as any of the above described design support apparatuses, or to execute any of the above described design support methods.

This program may be stored in various recording media such as a CD-ROM (Compact Disk Read Only Memory), an FD (Flexible Disk), etc., or may be distributed through a computer communications network such as the Internet.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

The embodiments of the present invention will be explained below with reference to the attached drawings.

Schematic Structure of Information Processing Apparatus

Figure 1:
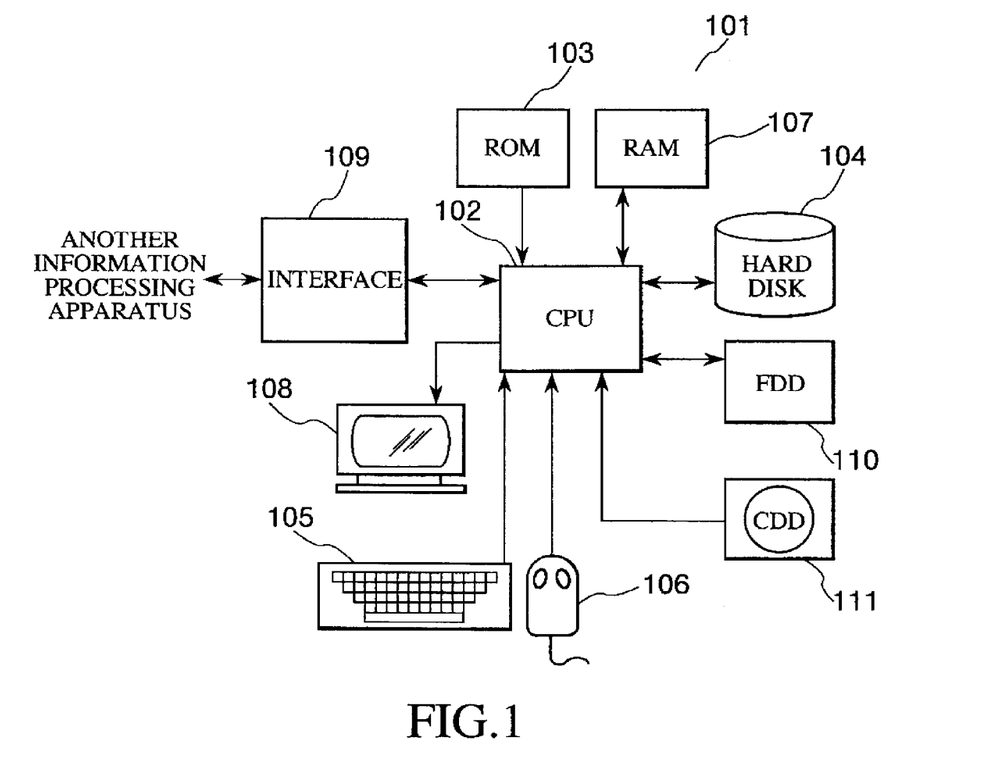
FIG. 1 is an exemplary diagram showing a schematic structure of an information processing apparatus.

FIG. 1 is an exemplary diagram showing a schematic structure of a typical information processing apparatus which can serve as a design support apparatus of the present invention by processing a recording medium storing data structure of the present invention.

The information processing apparatus 101 is controlled by a CPU (Central Processing unit) 102. When the information processing apparatus 101 is turned on, the CPU 102 executes IPL (Initial Program Loader) which is stored in a ROM 103.

The IPL is a program for reading and executing an OS (Operating System) program which is stored in a recording medium such as a hard disk 104, an FD inserted in an FD drive 110, a CD-ROM inserted in a CD-ROM drive 111, etc.

After starting the OS, the CPU 102 executes an application program stored in the hard disk, etc. in accordance with an instruction of a user input by a keyboard 105 or a mouse 106, or in accordance with a content of a setting file previously written in the hard disk, etc.

The information processing apparatus 101 serves as a design support apparatus by executing the application program.

Definition attribute, control attribute, strength information, stress information, and report information will be stored in a recording medium such as the hard disk 104, an FD inserted in the FD drive 110, a CD-ROM inserted in the CD-ROM drive 111, etc.

The CPU 102 uses a RAM 107 as a temporary work memory area when executing the application program. In addition, a register or cache (not illustrated) prepared in the CPU 102 is used as a temporary work memory area.

Along with the execution of the program, the CPU 102 can display report information or intermediate processing result on a display device 108 such as a liquid crystal display, a CRT (Cathode Ray Tube), etc., in order to notify or show such information to the user. When inputting instruction by the mouse 106, the user can move a cursor displayed on the screen by moving the mouse 106, and can select a menu pointed by the cursor by clicking the mouse 106.

The information processing apparatus 101 can perform data communication with a computer communications network such as the Internet, through an interface 109 such as NIC (Network Interface Card), a modem, etc. The information processing apparatus 101 can process information regarding a product to be designed which is received through the interface 109, can send processed report information through the interface 109, and can execute a program received through the interface 109.

There can be employed another embodiment where various kinds of report information are loaded to another computer, and URL (Universal Resource Locator) of the report information and abstracts of the report information are presented to the user. The user can obtain, if necessary, more detailed contents of the report information by accessing the URL through the interface 109.

Figure 2:
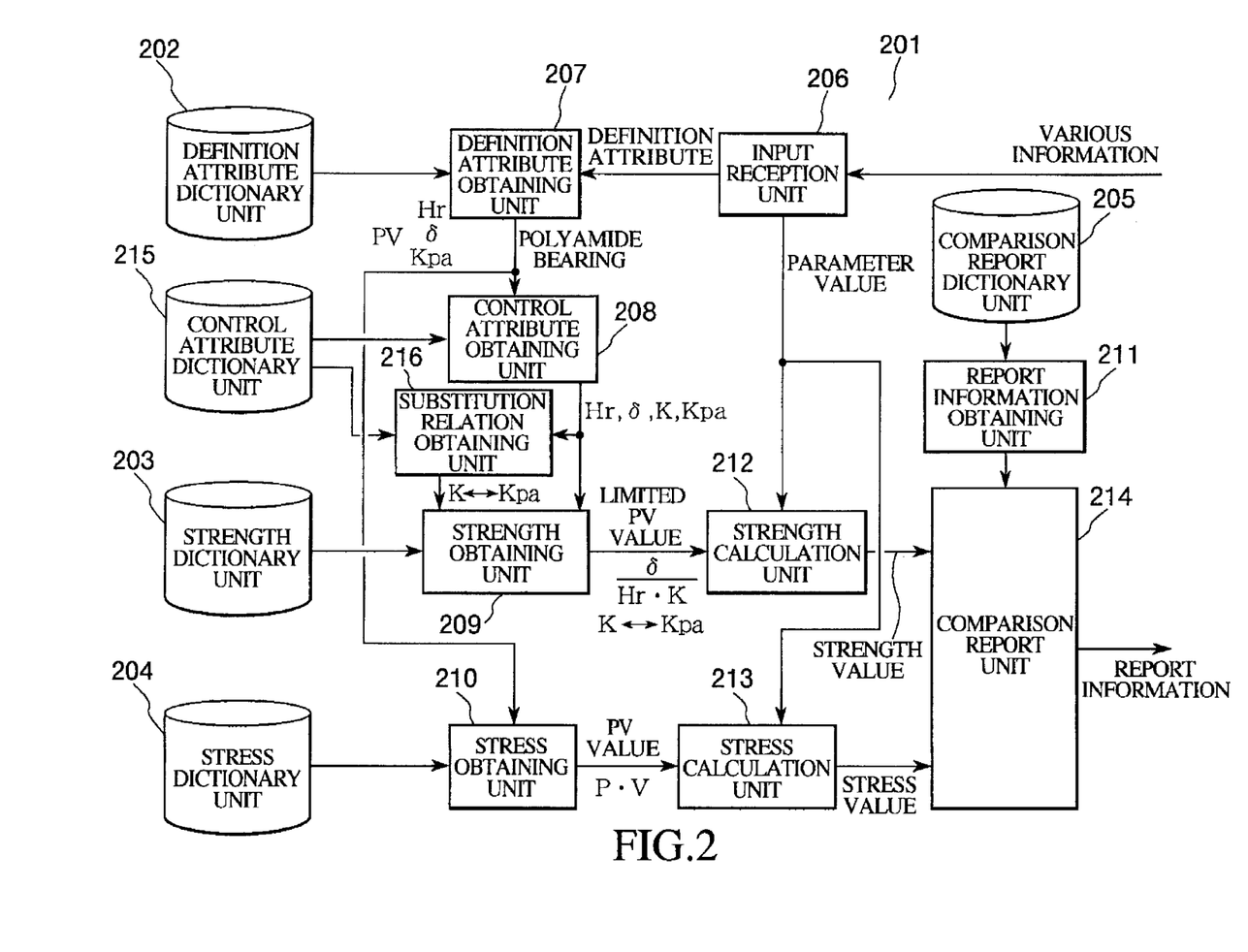
FIG. 2 is an exemplary diagram showing a schematic structure of a design support apparatus according to an embodiment of the present invention.

FIG. 2 is an exemplary diagram showing a schematic structure of a design support apparatus according to the embodiment of the present invention. The following explanation will be made with reference to FIG. 2. In the following explanation, a polyamide bearing will be employed as an example of designing.

A design support apparatus 201 comprises a definition attribute dictionary unit 202, a strength dictionary unit 203, a stress dictionary unit 204, a comparison report dictionary unit 205, an input reception unit 206, a definition attribute obtaining unit 207, a control attribute obtaining unit 208, a strength obtaining unit 209, a stress obtaining unit 210, a report information obtaining unit 211, a strength calculation unit 212, a stress calculation unit 213, a comparison report unit 214, a control attribute dictionary unit 215, and a substitution relation obtaining unit 216, and is structured as described below.

The definition attribute dictionary unit 202 stores a name of a definition attribute, a parameter name relating to the definition attribute, and a remark about whether the parameter name represents a control attribute or a stress attribute, in association with each other.

"Polyamide" and "radial bearing" can be raised as examples of the definition attribute names. Parameters relating to "polyamide" include "polyamide wear coefficient $K_{pa}$" which represents a control attribute.

Parameters relating to "radial bearing" include "guaranteed operation hour Hr", "amount of wear tolerance δ" and "wear coefficient K" as control attributes, and "pressure P applied to bearing" and "bearing sliding velocity V" as stress attributes.

Figure 3:
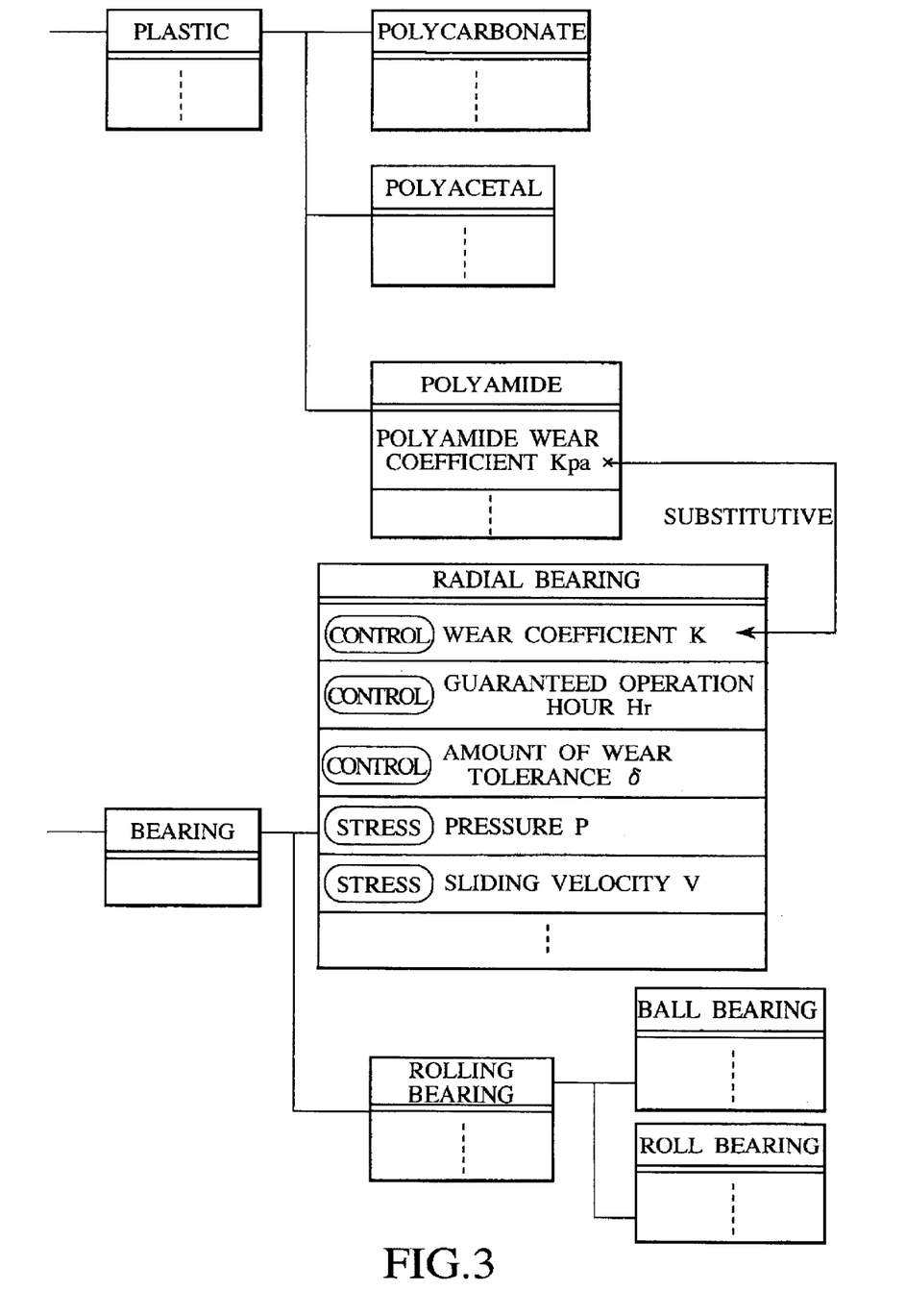
FIG. 3 is an exemplary diagram showing a schematic composition of data structure of information stored in a definition attribute dictionary unit and a control attribute dictionary unit.

FIG. 3 is an exemplary diagram showing a schematic composition of data structure of information which is stored in the definition attribute dictionary unit 202 and the control attribute dictionary unit 215.

As shown in FIG. 3, each information regarding definition attribute in the definition attribute dictionary unit 202 is stored in a hierarchical structure.

In a case where a parameter value associated with a given control attribute can be substituted by a parameter value associated with another control attribute, the control attribute dictionary unit 215 stores the name of the parameter which can be used as substitution, and the name of the parameter which can be substituted by another parameter, as substitution relation.

That is, the control attribute dictionary unit 215 stores parameter names of the above described control attributes "wear coefficient K", "polyamide wear coefficient $K_{pa}$", "guaranteed operation hour Hr", and "amount of wear tolerance δ", and also stores substitution relation that "wear coefficient K" can be substituted by "polyamide wear coefficient $Kp_a$".

As shown in FIG. 3, such substitution relation is organized in a hierarchical structure.

The strength dictionary unit 203 stores a name of a strength, a name of a parameter of a control attribute necessary for calculating the strength, and a procedure for calculating a value associated with the strength using the value associated with the parameter of the control attribute.

In the present embodiment, the strength dictionary unit 203 stores "limited PV value" as a strength name. The strength dictionary unit 203 stores "guaranteed operation hour Hr", "amount of wear tolerance δ", and "wear coefficient K" as parameter names of control attributes necessary for calculating the limited PV value, and also stores an equation "limited PV value=δ/(Hr·K)" as a process of calculating the strength value (limited PV value).

Figure 4:
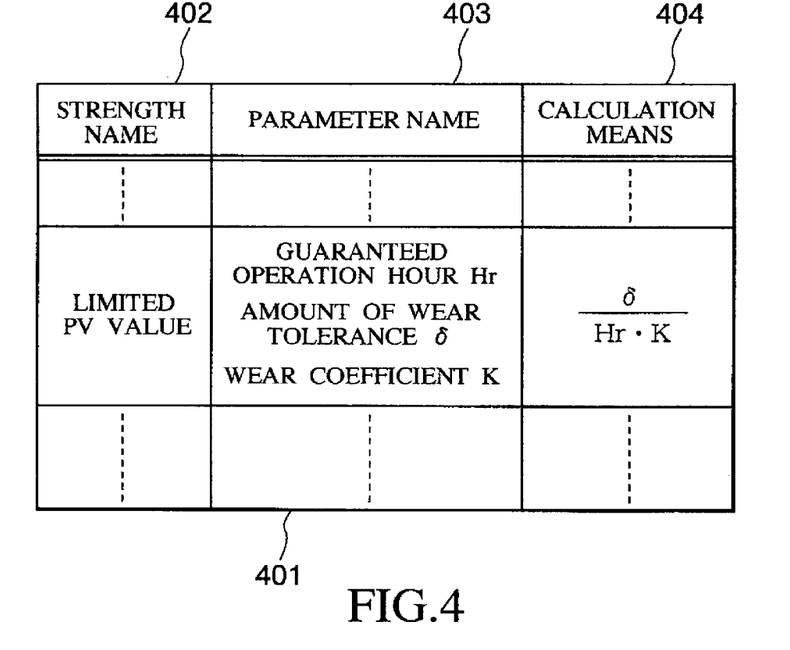
FIG. 4 is an exemplary diagram showing a schematic composition of data structure of information stored in a strength dictionary unit.

FIG. 4 is an exemplary diagram showing a schematic composition of data structure of information which is stored in the strength dictionary unit 203. As shown in FIG. 4, the strength dictionary unit 203 stores information in so-called table format.

Information is organized in the table 401 such that each strength corresponds to one of the rows, the name of each strength is stored in the column 402, one or more parameter name(s) of control attribute(s) for each strength is/are stored in the column 403, and a procedure for calculating the value associated with each strength is stored in the column 404.

The stress dictionary unit 204 stores a name of a stress, a name of a parameter relating to the stress, and a procedure for calculating the value associated with the stress using the value associated with the parameter.

In the present embodiment, the stress dictionary unit 204 stores "PV value" as a stress name. The stress dictionary unit 204 stores "pressure P applied to bearing" and "bearing sliding velocity V" as parameters of stress attributes necessary for calculating the stress, and stores an equation "PV value=P·V" as a procedure for calculating the stress value using those parameters.

Figure 5:
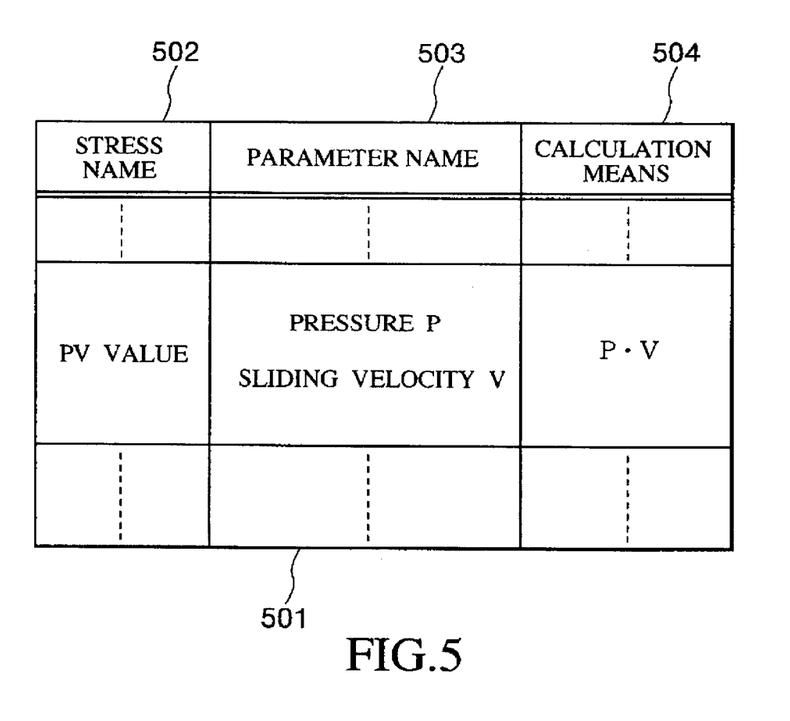
FIG. 5 is an exemplary diagram showing a schematic composition of data structure of information stored in a stress dictionary unit.

FIG. 5 is an exemplary diagram showing a schematic composition of data structure of information which is stored in the stress dictionary unit 204. As shown in FIG. 5, the stress dictionary unit 204 stores information in so-called table format, likewise the strength dictionary unit 203.

Information is organized in the table 501 such that each stress corresponds to one of the rows, the name of each stress is stored in the column 502, one or more parameter name(s) of stress attribute(s) for each stress is/are stored in the column 503, and a procedure for calculating the value associated with each stress is stored in the column 504.

The comparison report dictionary unit 205 stores a strength name, a stress name, a procedure for comparing those strength name and stress name, and report information representing information to be reported when result of the comparison satisfies a predetermined condition in association with one another.

In the present embodiment, the comparison report dictionary unit 205 stores "PV value" as a stress name, and "limited PV value" as a strength name. Further, the comparison report dictionary unit 205 stores an expression "PV value>limited PV value" as a procedure for comparing the stress name and strength name, and stores report information to be reported when this expression is satisfied.

In the present embodiment, the report information represents knowledge that "the bearing will cause a problem" and its related knowledge. Such knowledge may include various information, such as knowledge information for presenting an example of a problem caused in the past, URL (Universal Resource Locator) or a name of a database which stores this knowledge information, an inquiry code of the database, a record number in the database, etc. Further, such knowledge may include information for predicting what kind of bad condition may further be caused as the result of occurrence of the problem, or information necessary for finding out the cause of the problem.

Figure 6:
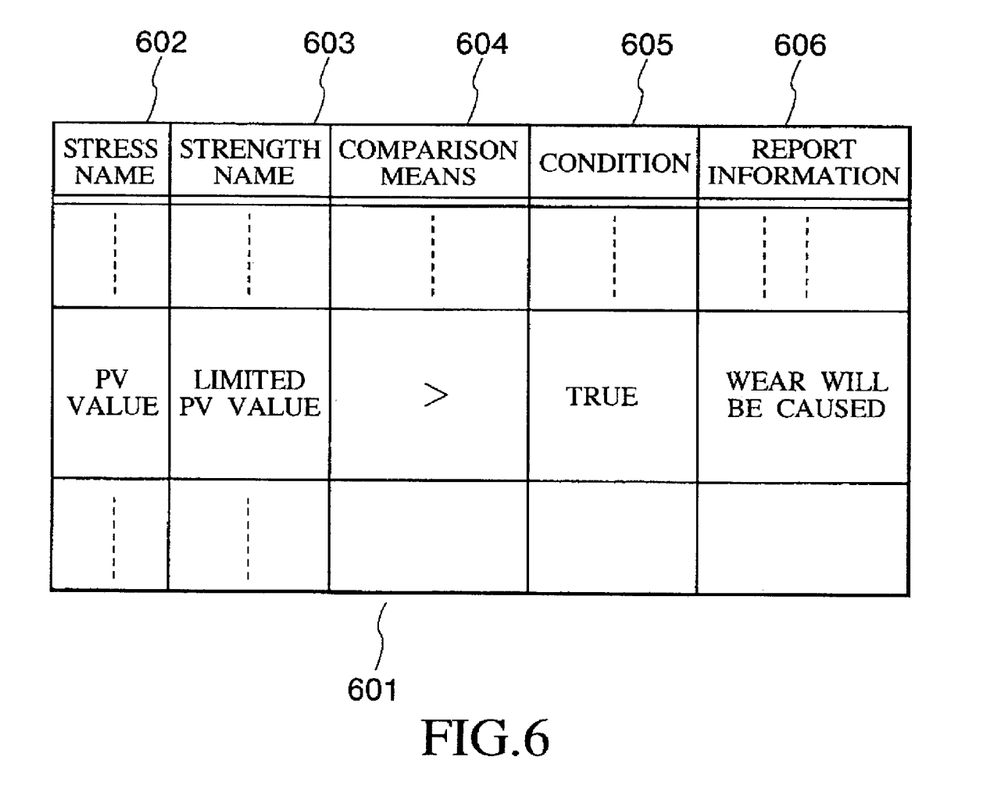
FIG. 6 is an exemplary diagram showing a schematic composition of data structure of information stored in a comparison report dictionary unit.

FIG. 6 is an exemplary diagram showing a schematic composition of data structure of information stored in the comparison report dictionary unit 205. As shown in FIG. 6, information stored in the comparison report dictionary unit 205 is also organized in table format.

Information is organized in the table 601 such that each report information corresponds to one of the rows, a stress name is stored in the column 602, a strength name is stored in the column 603, a procedure for comparing the stress name and strength name is stored in the column 604, a condition to be satisfied by a result of the comparison is stored in the column 605, and report information is stored in the column 606.

In FIG. 6, ">" comparison is specified as the means for comparing the stress name "PV value" and strength name "limited PV value", and "true" is stored as the condition to be satisfied by the result of this comparison. Instead of this, "−(subtraction)" comparison may be stored as the means for comparison, and "positive" may be stored as the condition to be satisfied by the result of the comparison. Or, various other calculations and conditions may be stored.

Figure 7:
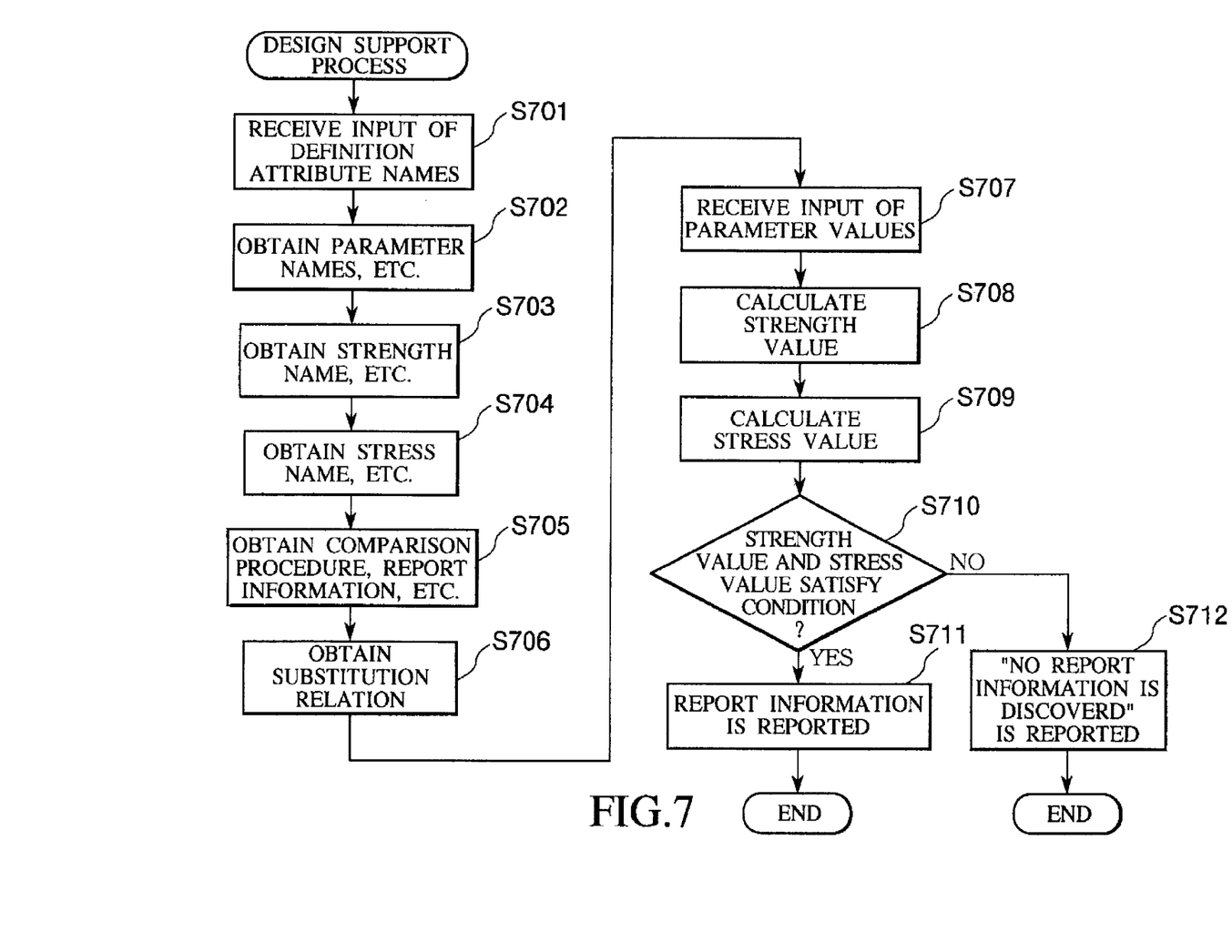
FIG. 7 is a flowchart showing procedures of a design support process.

FIG. 7 is a flowchart showing procedures of a design support process performed under circumstance where various information as described above are stored in advance. The following explanation will be made with reference to FIG. 7.

First, the input reception unit 206 receives input of definition attribute names of a product to be designed (step S701).

As a result, information regarding a product which a designer has designed with a CAD/CAM system is received. Or, the information regarding the product to be designed is directly received from the designer.

In the present embodiment, since the designer designs a "polyamide bearing", definition attribute names to be input in step S701 are "polyamide", and "radial bearing". Generally, various other definition attribute names are to be input in step S701.

Then, the definition attribute obtaining unit 207 obtains any of the input definition attribute names that is stored in the definition attribute dictionary unit 202, and parameter names relating to the obtained definition attribute name, and remark about whether each obtained parameter name is a control attribute or a stress attribute (step S702).

At this time, the control attribute obtaining unit 208 obtains the parameter names of control attributes obtained by the definition attribute obtaining unit 207 from the control attribute dictionary unit 215, in order to confirm that those parameter names are stored in the control attribute dictionary unit 215.

In the present embodiment, the definition attribute dictionary unit 202 stores parameter names of control attributes as character strings. However, the definition attribute dictionary unit 202 may store identification codes of the control attributes. In this case, the control attribute dictionary unit 215 will store the identification codes of the control attributes and character strings representing the parameter names in association with each other. And the control attribute obtaining unit 208 will refer to the control attribute dictionary unit 215 using the identification codes of the parameters of control attributes as keys, and obtain the parameter names of the control attributes from the control attribute dictionary unit 215.

As the result of step S702, "polyamide wear coefficient $K_{pa}$" (control attribute) is obtained for "polyamide", and "guaranteed operation hour Hr" (control attribute), "amount of wear tolerance δ" (control attribute), "wear coefficient K"

(control attribute), "pressure P applied to bearing" (stress attribute), and "bearing sliding velocity V" (stress attribute" are obtained for "radial bearing".

Then, the strength obtaining unit 209 obtains from the strength dictionary unit 203, a name of strength which can be calculated using the obtained parameter names of control attributes, and the procedure for calculating the value associated with the strength (step S703).

Thus, the strength obtaining unit 209 obtains the strength name "limited PV value" which can be calculated using "guaranteed operation hour Hr" (control attribute), "amount of wear tolerance δ" (control attribute), and "wear coefficient K" (control attribute), and the procedure "δ/(Hr·K)" for calculating the strength value.

On the other hand, the stress obtaining unit 210 obtains a name of stress which can be calculated using the obtained parameter names of stress attributes and the procedure for calculating the value associated with the stress from the stress dictionary unit 204 (step S704).

Thus, the stress obtaining unit 210 obtains the stress name "PV value" which can be calculated using "pressure P applied to bearing" (stress attribute) and "bearing sliding velocity V" (stress attribute), and the procedure "P·V" for calculating the stress value.

In a case where the obtained strength name which can be calculated and the obtained stress name which can be calculated are stored in association with each other in the comparison report dictionary unit 205, the report information obtaining unit 211 obtains the procedure for comparison and report information to be reported when the result of a comparison satisfies the predetermined condition, which are stored in association with the obtained strength name and obtained stress name (step S705).

In the present embodiment, the strength name "limited PV value" and the stress name "PV value" are stored in association with each other in the comparison report dictionary unit 205. Thus, the report information obtaining unit 211 obtains "PV value>limited PV value" as the procedure for comparison, and report information that "bearing will cause a problem" if the result of the comparison satisfies the condition.

The substitution relation obtaining unit 216 obtains any pair of parameter names of control attributes that is registered in the control attribute dictionary unit 215 as constituting a substitution relation, from among the obtained parameter names of control attributes (step S706).

In the present embodiment, a substitution relation that the parameter "wear coefficient K" can be substituted by the parameter "polyamide wear coefficient $K_{pa}$" (control attribute) is obtained.

Then, when the procedure for comparison and the report information are obtained by the report information obtaining unit 211, the input reception unit 206 further receives input of values of the obtained parameters of control attributes and values of the obtained parameters of stress attributes. In a case where any of the obtained parameter names of control attributes is a parameter name which is indicated by the obtained substitution relation as can be substituted by another parameter name, the input reception unit 206 receives input of a value associated with the parameter name which can be substituted, or a value associated with the parameter name which can be used as substitution (step S707).

Due to this step, the input reception unit 206 prompts the designer or the CAD/CAM system to input the parameter values of the following parameter names.

"guaranteed operation hour Hr"
"amount of wear tolerance δ"
either one of "wear coefficient K" and "polyamide wear coefficient $K_{pa}$"
"pressure P applied to bearing"
"bearing sliding velocity V"

The strength calculation unit 212 calculates the strength value using the input parameter values of control attributes in accordance with the obtained procedure for calculating the strength value. At this time, in a case where the obtained procedure for calculating the strength value designates the use of the parameter value associated with the parameter which is indicated by the obtained substitution relation as can be substituted while the input reception unit 206 receives input of the parameter value associated with the parameter which can be used as substitution instead of the parameter value associated with the parameter which can be substituted, the strength calculation unit 212 calculates the strength value by substituting the parameter value associated with the parameter which can be substituted, by the parameter value associated with the parameter which can be used as substitution (step S708).

In the present embodiment, the strength value "limited PV value" is calculated by an expression "δ/(Hr·K)" in a case where "wear coefficient K" is input, or by an expression "δ/(Hr·$K_{pa}$)" in a case where "polyamide wear coefficient $K_{pa}$ is input.

The stress calculation unit 213 calculates the stress value using the input parameter values of stress attributes in accordance with the obtained procedure for calculating the stress value (step S709).

In the present embodiment, the stress value "PV value" is calculated by an expression "P·V".

Then, the comparison report unit 214 compares the calculated strength value and the calculated stress value in accordance with the obtained procedure for comparison (step S710). In a case where the result of the comparison satisfies the predetermined condition (step S710; Yes), the comparison report unit 214 reports the obtained report information (step S711) and terminates the design support process.

On the contrary, in a case where the result of the comparison does not satisfy the predetermined condition (step S710; No), the comparison report unit 214 reports that no report information is discovered (step S712), and then terminates the design support process.

In the present embodiment, the calculated stress value (PV value) and the calculated strength value (limited PV value) are compared by an expression "PV value>limited PV value". In a case where this expression is satisfied, the report information that "the bearing will cause a problem" is reported.

As described in the present embodiment, upon reception of input of definition attributes and control attributes of the product to be designed, the strength value and the stress value can be calculated and the report information can be presented to the user.

Further, in the present embodiment, in consideration of the substitution relation between a control attribute and another control attribute, even if the value associated with a necessary control attribute is not input, but if the value associated with its substitutive control attribute is input, the strength value can be calculated using the value associated with the substitutive control attribute, and thus user's workload of inputting can be reduced.

Another Embodiment

The present embodiment is suited to a case where a parameter value associated with a control attribute can be calculated from other parameter values, in addition to the case explained in the above embodiment.

In a case where a parameter value associated with a given control attribute can be calculated in accordance with a calculation procedure using a parameter value associated with another control attribute, the control attribute dictionary unit 215 stores this calculation procedure, the name of the calculation-use parameter used in this calculation procedure, and the name of the parameter (calculation result parameter name) which is the result of calculation in accordance with this calculation procedure, as a calculation relation.

Figure 8:
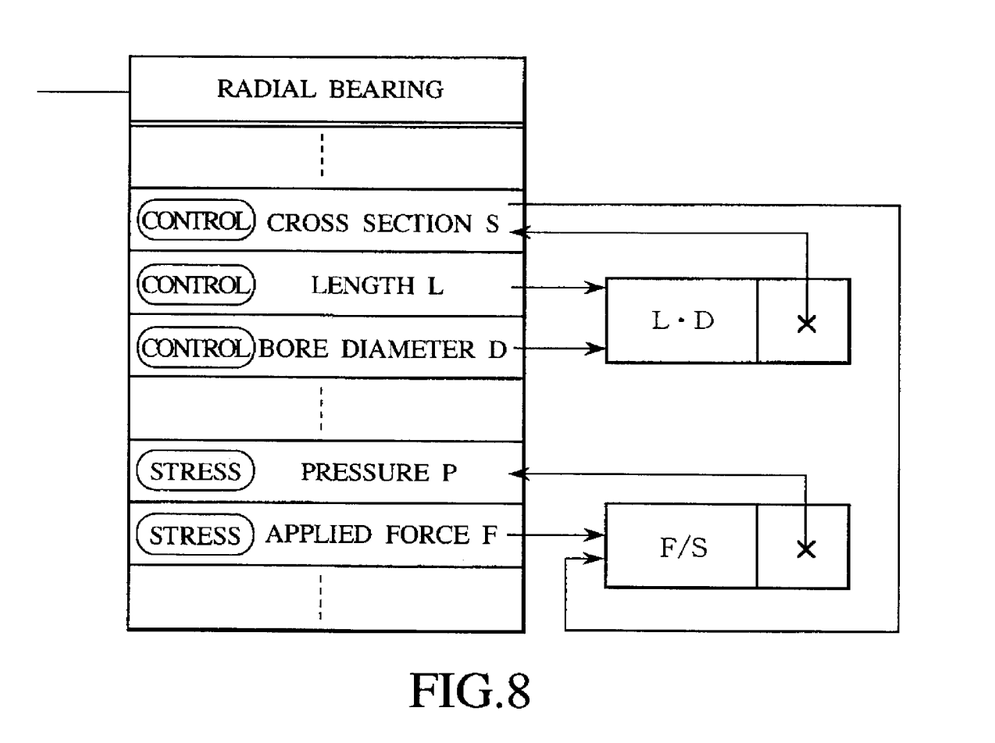
FIG. 8 is a diagram showing a schematic structure of a part of the control attribute dictionary unit.

For example, if there are provided control attributes "bearing length L" and "bore diameter D of bearing", "cross section S of bearing" can be calculated in accordance with a procedure "S=L·D".

FIG. 8 shows a schematic structure of a part of the control attribute dictionary unit 215 where such calculation relations are stored.

In step S706, the substitution relation obtaining unit 216 obtains a calculation relation in which an obtained parameter name of a control attribute is indicated as a calculation result parameter name and its calculation-use parameter name from the control attribute dictionary unit 215.

Further, in step S707, in a case where an obtained parameter name of a control attribute is a calculation result parameter name of an obtained calculation relation, the input reception unit 206 receives input of a parameter value associated with the calculation result parameter name, or instead of this, a parameter value associated with the calculation-use parameter name, For example, in a case where "cross section S of bearing" is a control attribute obtained as a parameter name necessary for calculating a strength value, the input reception unit 206 needs to receive input either one of "bearing length L and bore diameter D of bearing" and "cross section S of bearing" based on the obtained calculation relation.

Then, in step S708, in a case where an obtained procedure for calculating a value associated with the strength designates the use of the parameter value associated with the calculation result parameter name of the obtained calculation relation and the input reception unit 206 receives input of the parameter value associated with the calculation-use parameter name instead of the parameter value associated with the calculation result parameter name, the strength calculation unit 212 obtains the calculation procedure of the calculation relation from the control attribute dictionary unit 215, calculates the necessary parameter value using the input parameter value associated with the calculation-use parameter name in accordance with the calculation procedure, and finally calculates the strength value by substituting the parameter value associated with the calculation result parameter name by the calculated parameter value.

That is, in a case where "cross section S of bearing" is input, the strength value is calculated using this value. However in a case where "bearing length L and bore diameter D of bearing" are input, the strength value is calculated using "D·L" instead of "cross section S of bearing".

According to this embodiment, if a parameter value necessary for calculating the strength value can be calculated using a parameter value already input by the user, the strength value can be automatically calculated after calculating the necessary parameter value by using the already input parameter value and thereby user's workload of inputting can be reduced.

In the present embodiment, such calculation relation is utilized only for control attributes. However, similar calculation relation can be applied to between stress attributes, or to between a stress attribute and a control attribute. For example, "pressure P applied to bearing" (stress attribute) can be calculated using "force F applied to bearing" (stress attribute) and "cross section S of bearing" (control attribute) in accordance with "P=F/S". Accordingly, it is possible to reduce workload of inputting parameters with the use of this calculation relation, likewise the calculation relation between control attributes.

Another Embodiment

The design support apparatus 201 according to the present invention can be structured as described below.

The definition attribute dictionary unit 202 further stores a parent-child relation between a given definition attribute name and another definition attribute name.

For example, "bearing" includes two types, namely, "radial bearing" and "rolling bearing", and "rolling bearing" further includes two types, namely, "ball bearing" and "roller bearing". Parent-child relation among them can be stored as below.

"bearing" (parent)—"radial bearing" (child)
"bearing" (parent)—"rolling bearing" (child)
"rolling bearing" (parent)—"ball bearing" (child)
"rolling bearing" (parent)—"roller bearing" (child)

The above are a part extracted from a hierarchy of parent-child relation.

Also with regard to "spring", parent-child relations as described below can be considered.

"spring" (parent)—"leaf spring" (child)
"spring" (parent)—"coil spring" (child)
"coil spring" (parent)—"compression coil spring" (child)
"coil spring" (parent)—"tension coil spring" (child)
"coil spring" (parent)—"twist coil spring" (child)

With the use of such a parent-child relation, a so-called is-a relation such as "radial bearing is-a bearing" can be represented. The parent-child relation is not limited to the purpose of representing an is-a relation. As will be described below, the parent-child relation can be used for representing other relations.

In a case where any parent-child relation in which a definition attribute name already obtained by the definition attribute obtaining unit 207 is indicated as the child is stored in the definition attribute dictionary unit 202, the definition attribute obtaining unit 207 further obtains the definition attribute name of the parent of this parent-child relation, parameter names relating to this parent definition attribute, and remarks about whether each of these parameter names is a control attribute or a stress attribute.

For example, in a case where the product to be designed is a "roller bearing" unlike the above embodiments, in addition to the control attributes and stress attributes of "roller bearing", control attributes and stress attributes of "rolling bearing" and control attributes and stress attributes of "bearing" are also obtained.

In a case where an is-a relation is to be represented between a parent-child relation as described above, the field to be searched is expanded from a given definition attribute to a more general definition attribute. In other words, with regard to this case, the field to be searched is expanded from "child" to "parent". Accordingly, as will be described below, a relation other than an is-a relation can be expressed between a parent-child relation. It may be possible to consider that "a parent-child relation is a relation merely indicating the basic direction, i.e., in which direction the field to be searched is expanded".

If the number of control attributes and stress attributes to be obtained increases, the number of strength values and stress values which can be calculated using any of those obtained control attributes and stress attributes greatly increases. Further, the amount of report information to be obtained is also expected to increase.

According to the present embodiment, it is possible to increase the amount of report information to be obtained, by expanding the field to be searched toward the direction of parent, with regard to a given definition attribute which is in a parent-child relation. Especially in a case where a parent-child relation is constituted such that "the parent represents a more general nature and the child represents a more specific nature", it is possible to expand the field to be searched toward the generality.

Further, it is possible to treat a parent-child relation as a more general relation. That is, the definition attribute dictionary unit 202 can store a parent-child relation in which a given definition attribute name is the parent and another definition attribute name is the child, and as well can store its reversed parent-child relation in which the given definition attribute name is the child and the another definition attribute name is the parent.

In this case, since the both are the parent and the child of the other, it is more natural to associate those definition attribute names with each other in an "equal relation" or a "relation combined with a certain strong relationship". That is, it is possible to represent an "equal relation" and a "relation combined with a certain strong relationship" by using the data structure of a "parent-child relation".

In this case, an is-a relation is not the only relation that can be represented by a parent-child relation. An "equals-to" relation (equal relation, equivalent relation) and a "relates-to" relation (relation combined with a certain strong relationship) can also be represented by a parent-child relation.

A parent-child relation is a relation defining the direction in which the field to be searched is expanded, as described above. How to apply a parent-child relation to between definition attributes can be appropriately changed in accordance with the kind of the product to be designed or the field in which the design support apparatus 201 is used. Accordingly, it is possible to regard only a parent-child relation in which the both are the parent and the child of the other as a relates-to relation. And it is also possible to regard even a parent-child relation in which one is the parent and the other is the child, and the reverse is not satisfied, as a relates-to relation.

By using such relations, in a case where a definition attribute is obtained, in addition to the control attributes and stress attributes of the obtained definition attribute's own, control attributes and stress attributes of a definition attribute which is in a "equal relation" or a "relation combined with a certain strong relationship" with the obtained definition attribute can be obtained. Thus, it is possible to obtain more report information by expanding the field to be searched.

In the above explanation, if there is a parent-child relation, the field to be searched is expanded from the child to the parent. However, it is possible to expand the field to be searched in a reversed direction.

That is, in a case where any parent-child relation in which a definition attribute name already obtained by the definition attribute obtaining unit 207 is indicated as the parent is stored in the definition attribute dictionary unit 202 and there are a plurality of definition attribute names which are the children of this parent definition attribute, input for selecting one or more of the plurality of child definition attribute names is received. The definition attribute obtaining unit 207 obtains the selected child definition attribute name(s), parameter names relating to the selected child definition attribute name(s), and remarks about whether each of theses parameter names is a control attribute or a stress attribute.

For example, a "bearing" is assumed as the product to be designed, unlike the "radial bearing" in the above embodiments. In this case, first, the user is requested to input whether the product to be designed is a "radial bearing" or a "rolling bearing". If the user inputs the "rolling bearing", the user is further requested to input whether the product to be designed is a "ball bearing" or a "roller bearing". If the user input the "roller bearing", in addition to the control attributes and stress attributes of "bearing", control attributes and stress attributes of "rolling bearing" and control attributes and stress attributes of "roller bearing" are also obtained by the definition attribute obtaining unit 207.

A case where the parent is a definition attribute indicating a material or a component and the children are definition attributes indicating a brand name of the material and a model number of the component in which the product indicated by the child is designed, is suitable for expanding the field to be searched toward the direction of child.

According to this embodiment, it is possible to obtain more report information by expanding the field to be searched toward the direction of child with regard to a given definition attribute which is in a parent-child relation, and also possible to restrict the field to be searched so as not to be too broadened, by appropriately urging the user to put a limit to the field to be searched. Particularly, in a case where a parent-child relation is constituted such that "the parent represents a more general nature and the child represents a more specific nature", it is possible to expand the field to be searched toward the direction of specific nature. For example, report information which reports a problem to be caused not in a general "radial bearing" but in a "radial bearing" which is manufactured by a company A and whose model number is B, can be obtained.

This scheme can also be applied to the case where "equal relation" and "relation combined with a certain strong relationship" are expressed using a parent-child relation. According to this scheme, it is possible to obtain more report information by expanding the field to be searched while restricting the field to be searched so as not to be too broadened, by urging the user to appropriately put a limit to the field to be searched.

Another Embodiment

In the present embodiment, in addition to the relations described in the above embodiment, an exclusive relation is also taken into consideration.

The definition attribute dictionary unit 202 further stores an exclusive relation between a given definition attribute name and another definition attribute name.

For example, with regard to "plastic", the following exclusive relations can be considered.

"polyamide", "polycarbonate", and "polyacetal" in view of material

"thermoplastic resin" and "thermosetting resin" in view of thermal characteristics "conductivity" and "non-conductivity" in view of conductivity In a case where the definition attributes are organized and stored in such a hierarchical structure, it is possible to easily store exclusive relations.

Report information stored in the comparison report dictionary unit 205 includes a definition attribute name relating to the report information itself.

Among the obtained report information, the comparison report unit 214 reports report information whose corresponding condition indicated in the column 605 is satisfied and which does not include a definition attribute name which is stored in the definition attribute dictionary unit 202 as constituting an exclusive relation with an input definition attribute name.

For example, even if the input definition attribute name is "polyamide", report information regarding something other than "polyamide" may often be obtained (especially in a case where the field to be searched is expanded in accordance with a parent-child relation, an equal relation, or a relation combined with a certain relationship as in the above embodiment). Accordingly, in a case where the input definition attribute name is "polyamide", the comparison report unit 214 abandons report information regarding "polycarbonate" and "polyacetal" and does not report such report information.

Further, the input reception unit 206 may receive input of to-be-excluded definition attribute names which should be excluded from the product to be designed, in order for the user to specify unnecessary definition attribute names in advance. The comparison report unit 214 may report information whose corresponding condition is satisfied and which does not include the input to-be-excluded definition attribute names, among the obtained report information.

Further, the comparison report unit 214 may report information whose corresponding condition is satisfied and at least one of whose including definition attribute names is the input definition attribute name, among the obtained report information.

That is, in the above example, only in a case where any report information explicitly includes "polyamide", this report information is reported.

Due to this embodiment, it is possible to carefully select report information to be reported from among the obtained report information, and screen out unnecessary report information as much as possible, and thereby to present only necessary report information to the user.

As described above, it is possible to provide a design support apparatus and design support method suitable for discovering at the time of designing, possibility of causing any problem in a product to be designed, and a program for controlling a computer to realize such apparatus and method.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the resent invention.

This application is based on Japanese Patent Application No. 2002-76895 filed on Mar. 19, 2002 and including specification, claims, drawings and summary. The disclosure of the above Japanese Patent Application is incorporated herein by reference in its entirety.

What is claimed is:

1. A design support apparatus comprising: a definition attribute dictionary unit; a strength dictionary unit; a stress dictionary unit; a comparison report dictionary unit; an input reception unit; a definition attribute obtaining unit; a strength obtaining unit; a stress obtaining unit; a report information obtaining unit; a strength calculation unit; a stress calculation unit; and a comparison report unit, wherein:

said definition attribute dictionary unit stores a definition attribute name, parameter names which relate to the definition attribute name, and remarks about whether the respective parameter names are a control attribute or a stress attribute, in association with one another;

said strength dictionary unit stores a strength name, a parameter name of a control attribute which is necessary for calculating the strength name, and a procedure for calculating a value (strength value) associated with the strength name using a value (parameter value) associated with the parameter name;

said stress dictionary unit stores a stress name, a parameter name which relates to the stress name, and a procedure for calculating a value (stress value) associated with the stress name using a value (parameter value) associated with the parameter name;

said comparison report dictionary unit stores a strength name, a stress name, comparison means for comparing the strength name and the stress name, and report information to be reported in a case where a result of the comparison satisfies a predetermined condition, in association with one another;

said input reception unit receives an input of definition attribute names of a product to be designed;

said definition attribute obtaining unit obtains a definition attribute name which is stored in said definition attribute dictionary unit from among the input definition attribute names, parameter names which relate to the obtained definition attribute name, and remarks about whether the respective parameter names are a control attribute or a stress attribute;

said strength obtaining unit obtains a strength name which can be calculated using any of the obtained parameter names that is a control attribute, and a procedure for calculating a strength value associated with the strength name, from said strength dictionary unit;

said stress obtaining unit obtains a stress name which can be calculated using any of the obtained parameter names that is a stress attribute, and a procedure for calculating a stress value associated with the stress name, from said stress dictionary unit;

in a case where the obtained strength name which can be calculated and the obtained stress name which can be calculated are stored in association with each other in said comparison report dictionary unit, said report information obtaining unit obtains a comparison procedure which is stored in association with those strength name and stress name, and report information to be reported in a case where a result of the comparison satisfies a predetermined condition;

in a case where the comparison procedure and the report information are obtained by said report information obtaining unit, said input reception unit further receives an input of a parameter value associated with any of the obtained parameter names that is a control attribute and a parameter value associated with any of the obtained parameter names that is a stress attribute;

said strength calculation unit calculates a strength value in accordance with the obtained procedure for calculating a strength value, using the input parameter value associated with any of the obtained parameter names that is a control attribute;

said stress calculation unit calculates a stress value in accordance with the obtained procedure for calculating a stress value, using the input parameter value associated with any of the obtained parameter names that is a stress attribute; and said comparison report unit compares the calculated strength value with the calculated stress value in accordance with the obtained comparison procedure, and reports the obtained report information in a case where a result of the comparison satisfies a predetermined condition.

2. The design support apparatus according to claim 1, further comprising: a control attribute dictionary unit; and a substitution relation obtaining unit, wherein:

said control attribute dictionary unit stores, in a case where a parameter value associated with a parameter name which is a control attribute can be substituted by a parameter value associated with another parameter name which is a control attribute, the parameter name which can be used as substitution and the parameter name which can be substituted, as a substitution relation;

said substitution relation obtaining unit obtains a pair of parameter names which are control attributes and stored in said control attribute dictionary unit as a substitution relation, from among the obtained parameter names which are control attributes;

said input reception unit further receives, in a case where any of the obtained parameter names that is a control attribute is the parameter name which is indicated by the obtained substitution relation as can be substituted, an input of a parameter value associated with the parameter name which can be substituted, or a parameter value associated with the parameter name which can be used as substitution; and in a case where the obtained procedure for calculating a strength value designates use of the parameter value associated with the parameter name which is indicated by the obtained substitution relation as can be substituted and said input reception unit receives an input of the parameter value associated with the parameter name which can be used as substitution instead of the parameter value associated with the parameter name which can be substituted, said strength calculation unit calculates a strength value by substituting the parameter value associated with the parameter name which can be substituted, by the parameter value associated with the parameter name which can be used as substitution.

3. The design support apparatus according to claim 2, wherein:

in a case where a parameter value associated with a parameter name which is a control attribute can be calculated in accordance with a calculation procedure using a parameter value associated with another parameter name which is a control attribute, said control attribute dictionary unit further stores the calculation procedure, the parameter name (calculation-use parameter name) which is used in the calculation procedure, and the parameter name (calculation result parameter name) which is a result of the calculation procedure, as a calculation relation;

said substitution relation obtaining unit obtains a calculation relation which indicates any of the obtained parameter names that is a control attribute as a calculation result parameter name and its corresponding calculation-use parameter name, from said control attribute dictionary unit;

in a case where any of the obtained parameter name that is a control attribute is the calculation result parameter name of the obtained calculation relation, said input reception unit further receives an input of a parameter value associated with the calculation result parameter name, or a parameter value associated with the calculation-use parameter name; and in a case where the obtained procedure for calculating a strength value designates use of the parameter value associated with the calculation result parameter name of the obtained calculation relation and said input reception unit receives an input of the parameter value associated with the calculation-use parameter name instead of the parameter value associated with the calculation result parameter name, said strength calculation unit obtains the calculation procedure of the calculation relation from said control attribute dictionary unit, calculates a parameter value in accordance with the calculation procedure using the parameter value associated with the calculation-use parameter name whose input has been received, and calculates the strength value by substituting the parameter value associated with the calculation result parameter name by the calculated parameter value.

4. The design support apparatus according to claim 1, wherein:

said definition attribute dictionary unit further stores a parent-child relation between a definition attribute name and another definition attribute name; and in a case where any parent-child relation in which a definition attribute name which has already been obtained by said definition attribute obtaining unit is a child is stored in said definition attribute dictionary unit, said definition attribute obtaining unit obtains a definition attribute name which is a parent of the parent-child relation, parameter names which relate to the parent definition attribute name, and remarks about whether the respective parameter names are a control attribute or a stress attribute.

5. The design support apparatus according to claim 4, wherein said definition attribute dictionary unit can store a parent-child relation in which a given definition attribute name is a parent and another definition attribute name is a child, and also a parent-child relation in which the given definition attribute name is a child and the another definition attribute name is a parent.

6. The design support apparatus according to claim 1, wherein:

said definition attribute dictionary unit further stores a parent-child relation between a definition attribute name and another definition attribute name; and in a case where any parent-child relation in which a definition attribute name which has already been obtained by said definition attribute obtaining unit is a parent is stored in said definition attribute dictionary unit and there are a plurality of definition attribute names each of which is a child of the parent definition attribute name, said definition attribute obtaining unit receives an input for selecting one or more of the plurality of child definition attribute name(s), and obtains the selected child definition attribute name(s), parameter names which relate to the selected child definition attribute name(s), and remarks about whether the respective parameter names are a control attribute or a stress attribute.

7. The design support apparatus according to claim 6, wherein said definition attribute dictionary unit can store a parent-child relation in which a given definition attribute name is a parent and another definition attribute name is a child, and also a parent-child relation in which the given definition attribute name is a child and the another definition attribute name is a parent.

8. The design support apparatus according to claim 1, wherein:
said definition attribute dictionary unit further stores an exclusive relation between a definition attribute name and another definition attribute name;
report information stored in said comparison report dictionary unit includes a definition attribute name which relates to the report information itself; and
said comparison report unit reports, among obtained report information, report information whose corresponding predetermined condition is satisfied and which does not include a definition attribute name which is stored in said definition attribute dictionary unit as constituting an exclusive relation with any of the input definition attribute names.

9. The design support apparatus according to claim 1, wherein:
said input reception unit further receives an input of a to-be-excluded definition attribute name which should be excluded from the product to be designed;
report information stored in said comparison report dictionary unit includes a definition attribute name which relates to the report information itself; and
said comparison report unit reports, among the obtained report information, report information whose corresponding predetermined condition is satisfied and which does not include the input to-be-excluded definition attribute name.

10. The design support apparatus according to claim 1, wherein:
report information stored in said comparison report dictionary unit includes a definition attribute name which relates to the report information itself; and
said comparison report unit reports, among the obtained report information, report information whose corresponding predetermined condition is satisfied and at least one of whose including definition attribute names is any of the input definition attribute names.

11. A design support method which:
refers to: a definition attribute dictionary unit which stores a definition attribute name, parameter names which relate to the definition attribute name, and remarks about whether the respective parameter names are a control attribute or a stress attribute, in association with one another;
a strength dictionary unit which stores a strength name, a parameter name of a control attribute which is necessary for calculating the strength name, and a procedure for calculating a value (strength value) associated with the strength name using a value (parameter value) associated with the parameter name;
a stress dictionary unit which stores a stress name, a parameter name which relates to the stress name, and a procedure for calculating a value (stress value) associated with the stress name using a value (parameter value) associated with the parameter name; and
a comparison report dictionary unit which stores a strength name, a stress name, comparison means for comparing the strength name and the stress name, and report information to be reported in a case where a result of the comparison satisfies a predetermined condition, in association with one another; and comprises: an input receiving step; a definition attribute obtaining step; a strength obtaining step; a stress obtaining step; a strength calculating step; a stress calculating step; a report information obtaining step; and a comparison reporting step, wherein:
said input receiving step receives an input of definition attribute names of a product to be designed;
said definition attribute obtaining step obtains a definition attribute name which is stored in the definition attribute dictionary unit from among the input definition attribute names, parameter names which relate to the obtained definition attribute name, and remarks about whether the respective parameter names are a control attribute or a stress attribute;
said strength obtaining step obtains a strength name which can be calculated using any of the obtained parameter names that is a control attribute, and a procedure for calculating a value (strength value) associated with the strength name, from the strength dictionary unit;
said stress obtaining step obtains a stress name which can be calculated using any of the obtained parameter names that is a stress attribute, and a procedure for calculating a value (stress value) associated with the stress name, from the stress dictionary unit;
in a case where the obtained strength name which can be calculated and the obtained stress name which can be calculated are stored in association with each other in the comparison report dictionary unit, said report information obtaining step obtains a comparison procedure which is stored in association with those strength name and stress name, and report information to be reported in a case where a result of the comparison satisfies a predetermined condition;
in a case where the comparison procedure and the report information are obtained in said report information obtaining step, said input receiving step further receives an input of a parameter value associated with any of the obtained parameter names that is a control attribute and a parameter value associated with any of the obtained parameter names that is a stress attribute;
said strength calculating step calculates a strength value in accordance with the obtained procedure for calculating a strength value, using the input parameter value associated with any of the obtained parameter names that is a control attribute;
said stress calculating step calculates a stress value in accordance with the obtained procedure for calculating a stress value, using the input parameter value associated with any of the obtained parameter names that is a stress attribute; and
said comparison reporting step compares the calculated strength value with the calculated stress value in accordance with the obtained comparison procedure, and reports the obtained report information in a case where a result of the comparison satisfies a predetermined condition.

12. A program for causing a computer to act as the design support apparatus according to any one of claims 1 to 9.

* * * * *